United States Patent [19]

Henry

[11] 4,268,834
[45] May 19, 1981

[54] SINGLE UHF/VHF ANTENNA SYSTEM
[75] Inventor: Ralph A. Henry, Suffolk, Va.
[73] Assignee: General Electric Company, Portsmouth, Va.
[21] Appl. No.: 780,858
[22] Filed: Mar. 24, 1977
[51] Int. Cl.³ .............................................. H01Q 1/50
[52] U.S. Cl. ................................... 343/858; 343/722; 455/290
[58] Field of Search ............... 343/858, 702, 722, 852, 343/715; 325/383, 379, 385, 365

[56] References Cited
U.S. PATENT DOCUMENTS

| | | | |
|---|---|---|---|
| 2,295,383 | 9/1942 | Carlson | 325/383 |
| 3,522,608 | 8/1970 | Von Fange | 343/702 |
| 3,530,473 | 9/1970 | Ives | 343/702 |
| 3,611,198 | 10/1971 | Ma | 325/379 |

Primary Examiner—David K. Moore

[57] ABSTRACT

Serially connected UHF and VHF tuners and control of the lead lengths of the conductors to the tuners from the antenna permit utilization of a single antenna for both the UHF and VHF tuners without need for a crossover network. If the lead lengths are selected to present minimal impedance at the highest UHF frequencies to be received, the intrinsic input impedance for each tuner can be utilized as the crossover network, allowing UHF signals to be applied to the UHF tuner and VHF signals to be applied to the VHF tuner. By use of both external and internal leads in conjunction with a terminal block, each of the tuners is made available for dual antenna operation.

4 Claims, 3 Drawing Figures

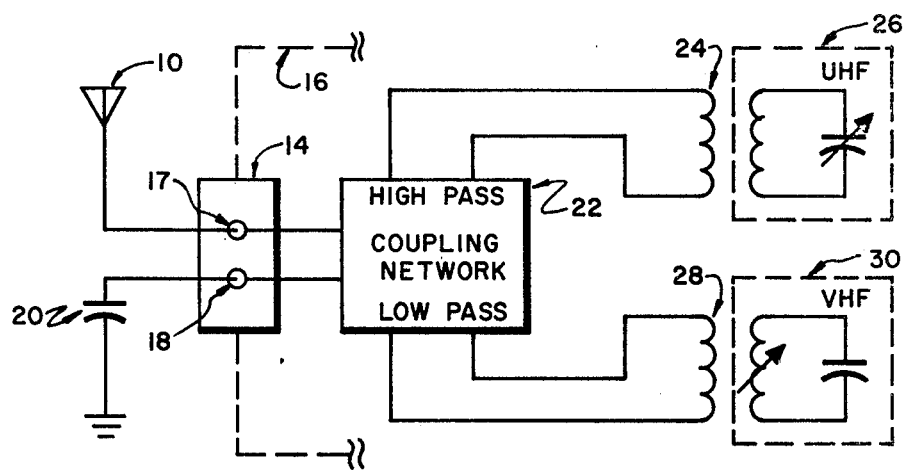
PRIOR ART
FIG. 1
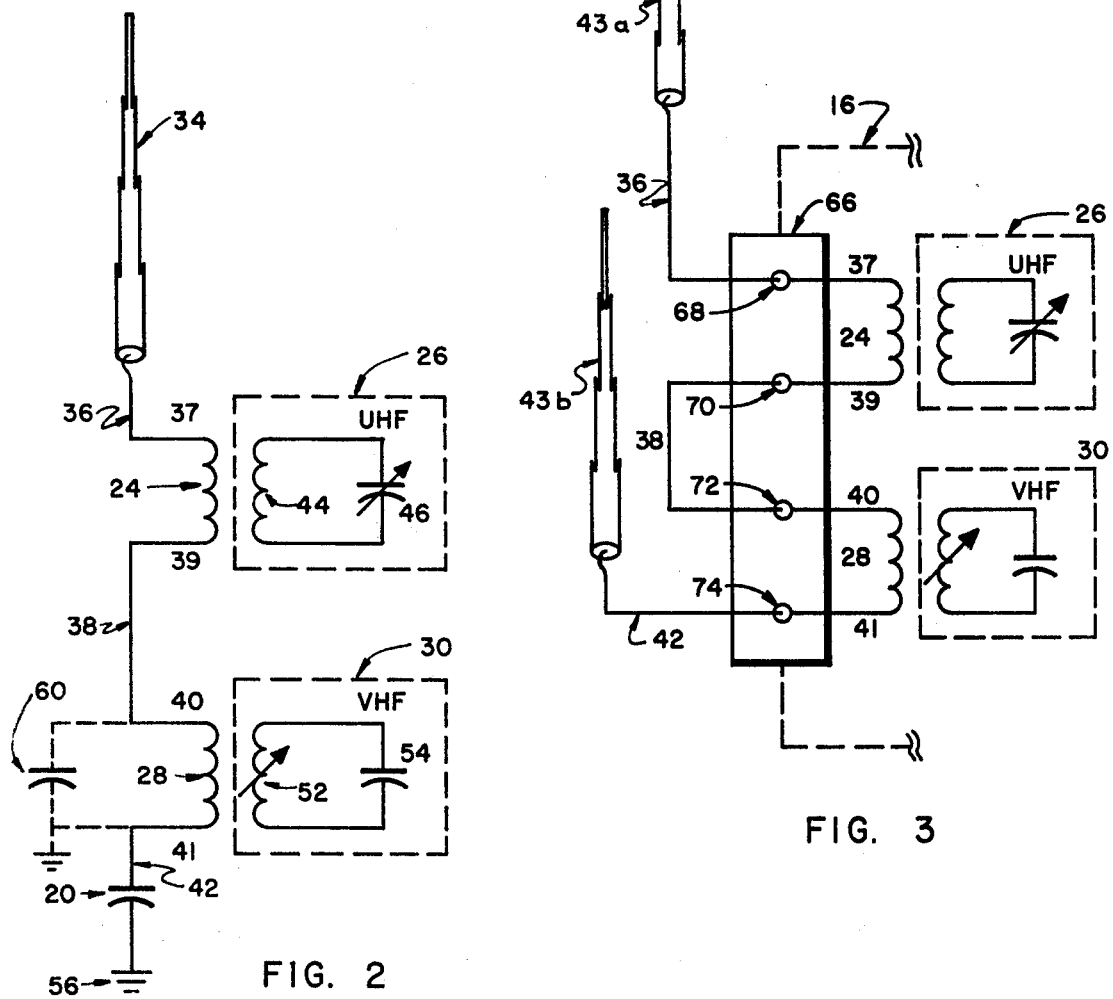
FIG. 2
FIG. 3

SINGLE UHF/VHF ANTENNA SYSTEM

BACKGROUND OF THE INVENTION

The present invention relates to a television antenna system employing a single antenna for reception of both UHF and VHF television signals.

Television sets manufactured for use in the United States are required by FCC regulations to be capable of receiving all UHF and VHF commercial and public television channels. To accomplish this, television receivers uniformly employ UHF and VHF converters or tuners and normally utilize two antenna systems, one for UHF signal reception, and the other for VHF signal reception. In weak signal areas frequently individual outdoor UHF and VHF antennas are coupled to the respective UHF and VHF tuners. It is accordingly highly desirable in the design of television receivers to provide external access to the UHF and VHF tuners.

In stronger signal areas, indoor ring or closed loop antennas are typically coupled to the UHF tuner and indoor dipole or "rabbit ear" antennas are typically coupled to the VHF tuner. Coupling in both cases is removably effected through a terminal block which allows external access to the UHF and VHF tuners for connection to outdoor antennas.

Use of separate antennas for UHF and VHF reception involves an obvious duplication of material, space and cost which might be eliminated by a single antenna system. However, while single antenna systems reduce the number of antennas from two to one, in the past, single antenna systems have required an additional crossover network or switching device not employed in a dual antenna system to allow the UHF and VHF tuners to be selectively coupled to the single antenna. The need for additional components in a single antenna system ranges from an employment of a simple inductor as disclosed in the R. D. Ives U.S. Pat. No. 3,530,473, issued Sept. 22, 1970, to utilization of a high pass, low pass filter as disclosed in the E. K. Von Fange U.S. Pat. No. 3,522,608, issued Aug. 4, 1970 and assigned to the assignee of the present invention. It is, accordingly, an object of the present invention to provide a single antenna system for a television receiver which is used for both UHF and VHF reception.

Another object of the present invention is to provide a single antenna system for UHF and VHF reception without utilization of added crossover or switching networks.

A further object of the present invention is to provide a single indoor antenna system for VHF and UHF television reception which allows separate UHF and VHF antennas to be selectively connected to the television receiver.

The single UHF/VHF antenna system of the present invention utilizes the intrinsic impedance of the input coupling network of each tuner by serially interconnecting the two tuners. Short internal leads from the terminal block to the two tuners, and especially the leads to the VHF tuner which ideally should be less than one-quarter wave length at the highest UHF frequency to be received, enables the tuner input coupling network impedances to act as the only crossover network. By combining internal and external connections in conjunction with a terminal board, each tuner is made accessible to being coupled to an individual antenna.

DESCRIPTION OF THE DRAWINGS

A greater appreciation of the objects and advantages of the invention may be understood by a detailed description taken in conjunction with the drawings, wherein:

FIG. 1 is a schematic diagram of a prior art arrangement for coupling a single antenna to the inputs of UHF and VHF tuners.

FIG. 2 is a schematic diagram of a preferred embodiment of the present invention; and FIG. 3 is a schematic diagram of the alternate embodiment of the present invention including a single dipole antenna system with a terminal block arrangement for providing external access to the UHF and VHF tuners of a television receiver.

DETAILED DESCRIPTION

Referring to FIG. 1, there is shown a schematic diagram which illustrates a prior art arrangement for coupling a single antenna to the inputs of UHF and VHF tuners. Specifically, a single antenna 10 is coupled to a first terminal 17 of terminal block 14, terminal block 14 being located on an externally accessible portion of a television receiver housing illustrated by dotted line 16. A second terminal 18 of terminal block 14 has connected to it a conductor external to television receiver housing 16 which couples terminal 18 to ground through capacitor 20.

Inside television housing 16, the prior art coupling network 22 has both high pass and low pass filtering characteristics. UHF signals received by antenna 10 are transmitted by the high pass section of coupling network 22 to UHF coupling coil 24 which in turn couples the UHF signals to UHF tuner 26. VHF signals received at antenna 10 are transmitted by the low pass filter in coupling network 22 to VHF coupling coil 28 which in turn couples the VHF signals to VHF tuner 30.

In the arrangement illustrated in FIG. 1, the high pass filter of coupling network 22 prevents VHF signals from passing to UHF tuner 26 and and the low pass filter of coupling network 22 prevents UHF signals from passing to VHF tuner 30.

The primary disadvantages inherent in the single antenna system illustrated in FIG. 1 include the necessity of employing the components comprising the high pass and low pass filters of coupling network 22. In addition, no access is readily available to UHF tuner 26 and VHF tuner 30 outside television receiver housing 16. Accordingly, there is no readily accessible means to disconnect the prior art single antenna system illustrated in FIG. 1 and to employ in its place separate external VHF and UHF antennas, particularly if the television receiver should be moved to a weak television signal area.

Turning to FIG. 2, wherein like reference symbols designate like elements, there is illustrated a schematic diagram of a single antenna system for use with both VHF and UHF reception in accordance with the teachings of the present invention. This system eliminates the necessity of any extrinsic high pass and low pass filter coupling network.

In accordance with the present invention, there is shown in FIG. 2 a single antenna which like the single antenna 10 in FIG. 1, may comprise a monopole adjustable rod antenna 34. As is shown more fully with reference to FIG. 3, the single antenna may also comprise a dipole e.g. rabbit ears, or any other single antenna system including an outdoor antenna.

Antenna means 34 is coupled by means of lead 36 and 37 directly to a UHF input coupling means, such as the coil 24, which provides coupling of UHF signals to a UHF tuner 26, illustrated in FIG. 2 by inductor 44 and variable capacitor 46. It is noted that the connection between antenna means 34 and UHF input coil means 24 is a direct connection without reliance upon crossover or switching networks.

In accordance with the teachings of the present invention, the antenna system illustrated in FIG. 2 further comprises a link conductor 38 coupled directly between UHF coil 24 and VHF input coupling means, such as the coil 28 by means of leads 39 and 40. VHF input coil means 28 provides coupling of VHF signals to a VHF tuner 30 represented in FIG. 2 by variable inductor 52 and capacitor 54. The VHF input coil means 28 is shown coupled to ground plane 56 through capacitor 20 and leads 41 and 42. Capacitor 20 is chosen to provide a short circuit to radio frequency signals but isolates the antenna system of the present invention from 60 cycle AC voltage potential which may possibly exist on ground plane 56. In order to realize the coupling of the UHF input means to ground by the VHF input coupling means, the design of the antenna system must give special attention to the impedance presented by the leads. Thus, leads 37, 39, 38, 40 and 41 need to be short. In particular, leads 40 and 41, which are internal to the receiver and as they lie in parallel represent a length of transmission line, ideally should be less than one-quarter wave length at the highest UHF frequency in order that the low impedance coupling of the VHF input coupling means at high UHF frequencies can be realized.

In operation of the present invention, a UHF radio frequency signal is received by selecting a UHF channel by means of the receiver's channel selection knob, not shown, and adjusting the antenna means 10 such as by selecting the length and direction of the monopole 34. The tuned UHF signal is coupled directly to UHF input means 24 for coupling the UHF signal to UHF tuner 26. UHF input means 24 is in turn radio frequency coupled to ground plane 56 through the low impedance of VHF input coil means 28 which exists in VHF coil input means 28 at UHF frequencies and is illustrated in FIG. 2 by capacitor 60.

For coupling VHF frequencies from the antenna to VHF tuner 30, the impedance of the UHF input coupling means 24 is quite low so that VHF frequencies are coupled directly to VHF input coupling means 28 without the need of an extrinsic crossover network. Thus, for UHF frequencies the input capacitance of the VHF input coupling means and low impedance short leads are utilized to essentially remove the VHF tuner from the antenna system. For VHF frequencies, the UHF tuner is basically shorted out of the antenna system by the low impedance input coupling means 24 so that VHF signals are coupled directly to the VHF tuner. Thus, as can be seen, the intrinsic impedance characteristics of the input coupling means of the UHF and VHF tuners at the different frequency bands are utilized without resort to extra crossover or switching networks to realize employment of a single antenna system.

Turning now to FIG. 3, there is shown an alternate embodiment of the present invention including means for external access to the UHF and VHF input coils and a single dipole antenna. FIG. 3 illustrates a four terminal connecting pad or terminal block 66 having first, second, third and fourth terminals 68, 70, 72 and 74. Terminal block means 66 is shown mounted on television receiver housing 16 in a manner which allows for external access thereto. FIG. 3 further illustrates a single antenna means in the form of a dipole antenna 43 removably connected by first monopole 43a to input terminal 68 by lead 36 and by second monopole 43b to input terminal 74 by lead 42. Lead 37 is also connected to input terminal 68 to couple UHF input coupling means 24 thereto. Coupling means 24 is coupled at its other end to input terminal 70 by lead 39. External lead 38 serves to link the UHF input coupling means 24 in series with the VHF input coupling means 28, which is coupled to terminals 72 and 74 by leads 40 and 41 respectively. The series circuit is completed by connection to the second half of the rabbit ears antenna 43b by lead 42.

Thus, terminal block 66 of FIG. 3 affords direct access means to each of the tuners 26 and 30 so that by disconnecting link 38 (and capacitor 20 in the embodiment of FIG. 2); a separate VHF antenna can be connected to terminals 68, 70 and a separate VHF antenna can be connected to terminals 72, 74. In this manner, the present invention provides not only a single antenna system for television receivers without resort to an extrinsic crossover or switching network, but also such a single antenna system with ready conversion to separate UHF and VHF antennas.

What is claimed and desired to be secured by Letters Patent of the United States is:

1. A single antenna system for the UHF and VHF tuners of a television receiver, comprising:
   a single antenna,
   UHF tuner input impedance means for coupling UHF signals into said UHF tuner,
   VHF tuner input impedance means for coupling VHF signals into said VHF tuner,
   UHF input terminals and VHF input terminals, and
   interconnecting means including UHF conductors connecting said UHF tuner input impedance means to said UHF input terminals, VHF conductors connecting said VHF tuner input impedance means to said VHF input terminals, antenna conductor means connecting said single antenna to at least one of said UHF input terminals and a link conductor connecting one of said UHF input terminals to one of said VHF input terminals, said interconnecting means forming a series interconnection of said single antenna, said UHF tuner input impedance means and said VHF tuner input impedance means,
   the conductors comprising said interconnecting means being of such length, in particular said VHF conductors being shorter than one quarter wave length at the highest UHF frequency to be received, such that the intrinsic impedance of the UHF tuner impedance means for VHF frequencies and the intrinsic impedance of the VHF tuner input impedance means for UHF frequencies comprise the only crossover network for the single antenna system.

2. A single antenna system as recited in claim 1 wherein said single antenna comprises a monopole antenna connected to one of said UHF input terminals,
   said link conductor connecting the other of said UHF input terminals to one of said VHF input terminals, and
   capacitive means connecting the other of said VHF input terminals to ground.

3. A single antenna system as recited in claim 1 wherein said single antenna comprises a dipole antenna having first and second monopole elements thereof,
 said antenna conductor means connecting one of said monopole elements to one of said UHF terminals, said link conductor connecting the other of said UHF input terminals to one of said VHF input terminals, and said antenna conductor means connecting the other of said monopole elements to the other of said VHF input terminals.

4. A single antenna system as recited in claim 1 wherein said link conductor is shorter than one-quarter wave length at the highest UHF frequency to be received.

* * * * *